US012320630B2

(12) United States Patent
Zhao et al.

(10) Patent No.: US 12,320,630 B2
(45) Date of Patent: Jun. 3, 2025

(54) DIMENSION MEASUREMENT APPARATUS, SEMICONDUCTOR MANUFACTURING APPARATUS, AND SEMICONDUCTOR DEVICE MANUFACTURING SYSTEM

(71) Applicant: Hitachi High-Tech Corporation, Tokyo (JP)

(72) Inventors: Pushe Zhao, Tokyo (JP); Takeshi Ohmori, Tokyo (JP); Yutaka Okuyama, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/432,062

(22) PCT Filed: Jun. 22, 2020

(86) PCT No.: PCT/JP2020/024365
§ 371 (c)(1),
(2) Date: Aug. 18, 2021

(87) PCT Pub. No.: WO2021/260765
PCT Pub. Date: Dec. 30, 2021

(65) Prior Publication Data
US 2023/0114432 A1 Apr. 13, 2023

(51) Int. Cl.
*G01B 11/24* (2006.01)
*G01B 11/02* (2006.01)
(Continued)

(52) U.S. Cl.
CPC ............ *G01B 11/24* (2013.01); *G01B 11/028* (2013.01); *G06T 7/001* (2013.01); *G06T 7/507* (2017.01);
(Continued)

(58) Field of Classification Search
CPC .. G01B 11/24; G01B 11/028; G01B 2210/56; G01B 11/022; G06T 7/001; G06T 7/507;
(Continued)

(56) References Cited

U.S. PATENT DOCUMENTS 9,142,184 B1 9/2015 Tiwari et al.
10,282,837 B2 * 5/2019 Kurihara ............... G06T 7/0012
(Continued)

FOREIGN PATENT DOCUMENTS

CN 106482636 A 3/2017
CN 114450580 A * 5/2022 ............. G01B 11/25
(Continued)

OTHER PUBLICATIONS

Parashar et al. "Intelligent Photolithography Corrections Using Dimensionality Reductions", IEEE Phot. Journal, Nov. 5, 2019 (Year: 2019).*

(Continued)

*Primary Examiner* — Mohamed K Amara
(74) *Attorney, Agent, or Firm* — Miles & Stockbridge, P.C.

(57) ABSTRACT

A dimension measurement apparatus that automatically corrects a deviation of a contour without operator determination. The dimension measurement apparatus includes: a model learning unit that obtains a learning cross-sectional image and learning labels attached to different regions of the learning cross-sectional image and generates a deep learning model for image region division using the learning cross-sectional image and the learning labels; a model estimation unit that applies the model to a newly input target image and labels each independent region; a contour correction unit that detects a contour of each region using the target image and the labels, sets a representative point on the contour of the region, moves each representative point according to a (Continued)

movement rule, and repeats movement of the representative point until contour correction is complete; and a dimension measurement unit that measures a dimension of a device cross-sectional structure using the corrected contour.

14 Claims, 10 Drawing Sheets

(51) Int. Cl.
 G06T 7/00 (2017.01)
 G06T 7/507 (2017.01)
 H01L 21/66 (2006.01)
(52) U.S. Cl.
 CPC .......... *H01L 22/12* (2013.01); *G01B 2210/56* (2013.01); *G06T 2207/30148* (2013.01)
(58) Field of Classification Search
 CPC . G06T 2207/30148; G06T 7/13; G06T 7/181; G06T 2207/10061; G06T 2207/20081; G06T 2207/20084; G06T 7/0004; G06T 7/60; H01L 22/12; H01L 22/20; G06N 20/00
 See application file for complete search history.

(56) References Cited

U.S. PATENT DOCUMENTS

| | | | |
|---|---|---|---|
| 11,037,269 B1 * | 6/2021 | Schluessler | G06T 1/20 |
| 11,301,748 B2 * | 4/2022 | Sha | G06T 7/0004 |
| 11,348,269 B1 * | 5/2022 | Ebrahimi Afrouzi | G01S 17/86 |
| 11,481,918 B1 * | 10/2022 | Ebrahimi Afrouzi | G06V 10/10 |
| 2005/0270905 A1 * | 12/2005 | Patterson | G06V 10/255 |
| | | | 367/88 |
| 2013/0026361 A1 * | 1/2013 | Yamanashi | G06T 7/74 |
| | | | 250/306 |
| 2013/0176401 A1 * | 7/2013 | Monari | H04N 5/222 |
| | | | 348/157 |
| 2016/0045841 A1 * | 2/2016 | Kaplan | C01B 32/05 |
| | | | 429/49 |
| 2016/0245644 A1 * | 8/2016 | Yamamoto | G01B 11/2518 |
| 2017/0061614 A1 | 3/2017 | Kurihara | |
| 2017/0076446 A1 * | 3/2017 | Pedersen | G06T 7/194 |
| 2018/0374232 A1 * | 12/2018 | Kadowaki | G06T 7/62 |
| 2020/0027021 A1 * | 1/2020 | Sastry | G06N 20/00 |
| 2020/0201019 A1 * | 6/2020 | Takasugi | H01J 37/3178 |
| 2022/0053122 A1 * | 2/2022 | Scheiner | A01G 7/00 |
| 2022/0395861 A1 * | 12/2022 | Snow | G06F 3/016 |

FOREIGN PATENT DOCUMENTS

| | | |
|---|---|---|
| JP | 2012-002765 A | 1/2012 |
| JP | 2013005983 A | 1/2013 |
| JP | 2014026452 A | 2/2014 |
| JP | 2017049035 A | 3/2017 |
| TW | 201510878 A | 3/2015 |
| WO | 2014208257 A1 | 12/2014 |

OTHER PUBLICATIONS

Office Action mailed Apr. 6, 2022 in Taiwanese Application No. 110122512.
Office Action mailed Nov. 11, 2023 in Korean Application No. 10-2021-7018341 .
Search Report mailed Feb. 18, 2020 in International Application No. PCT/JP2020/024365.

* cited by examiner

[FIG. 1]
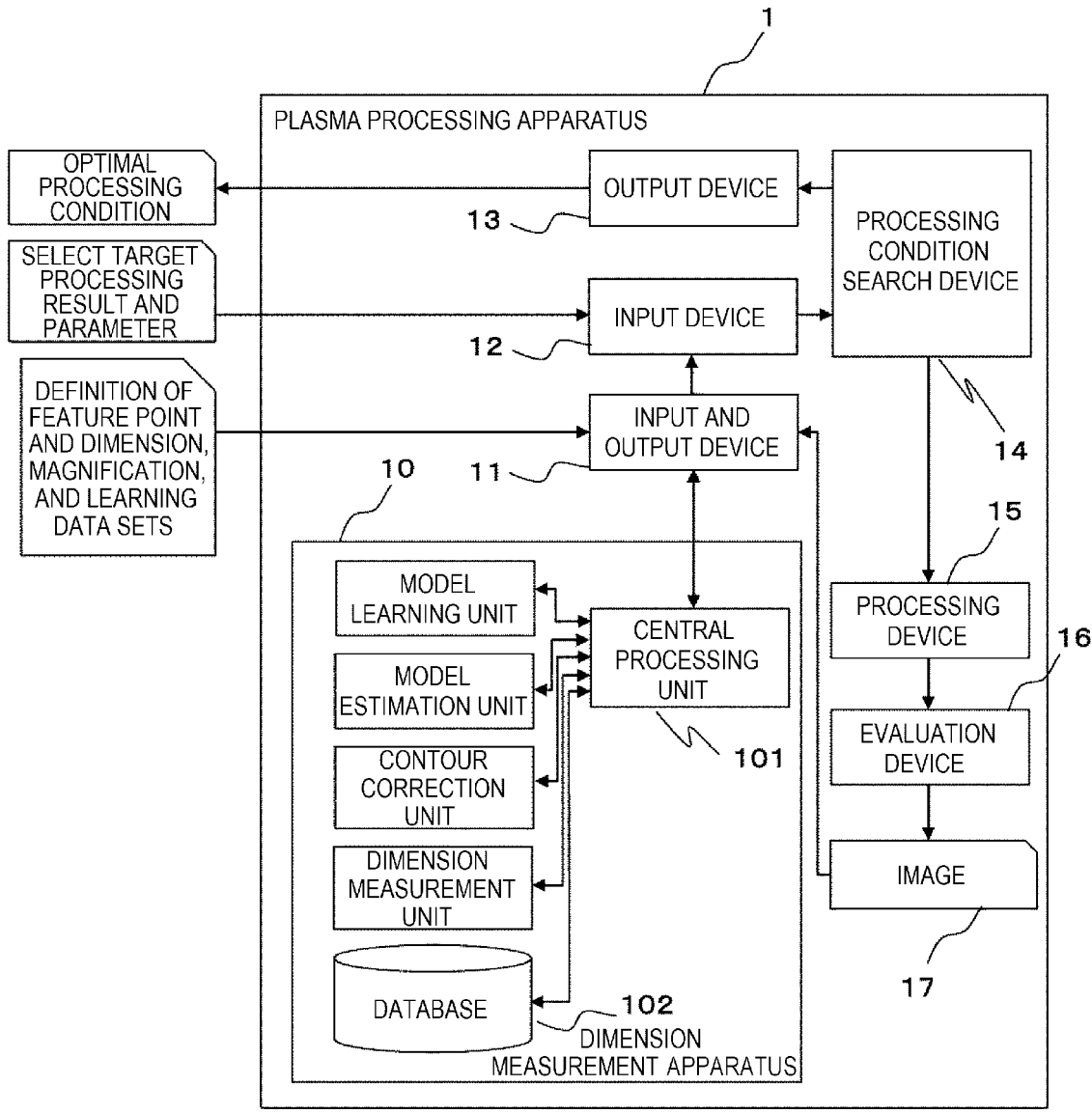

[FIG. 2]
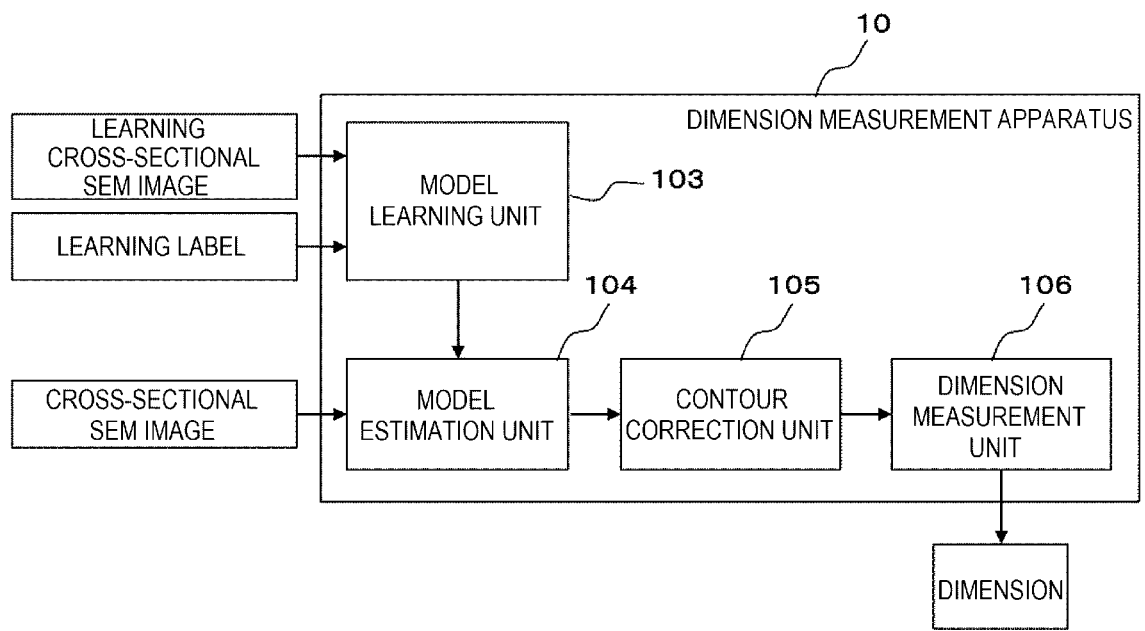

[FIG. 3]
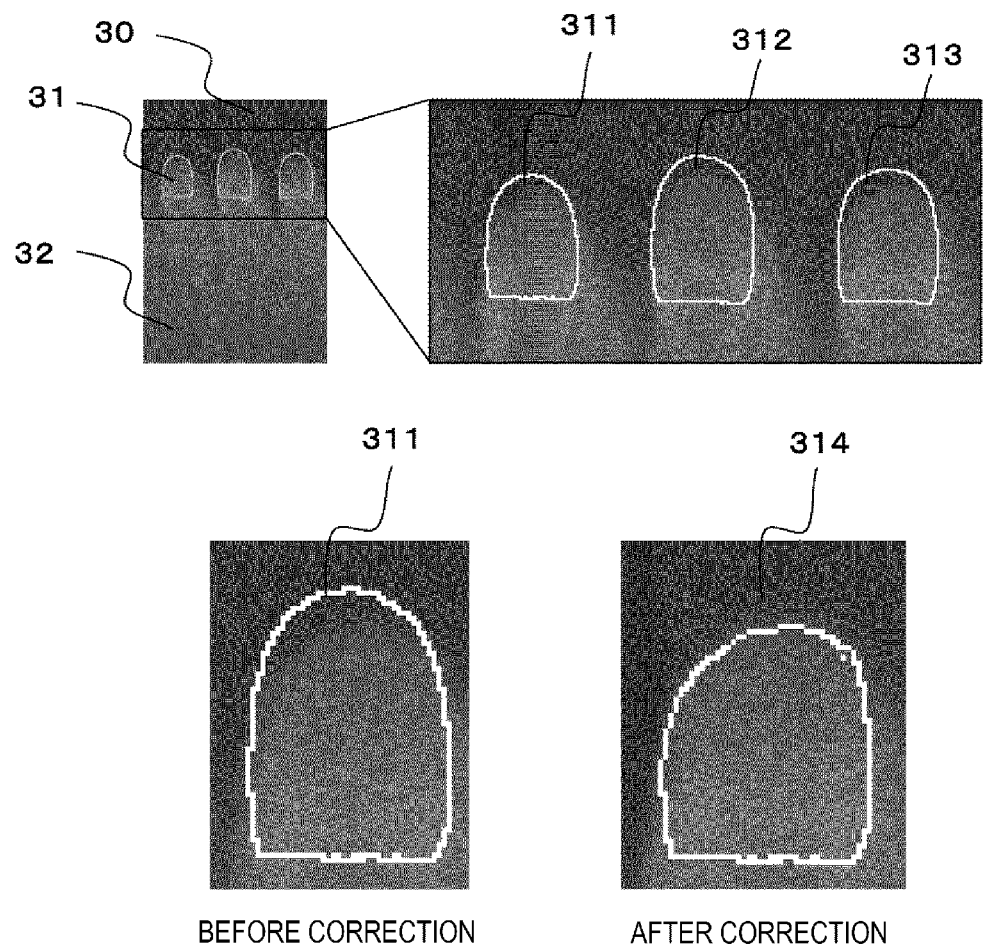
BEFORE CORRECTION     AFTER CORRECTION

[FIG. 4]
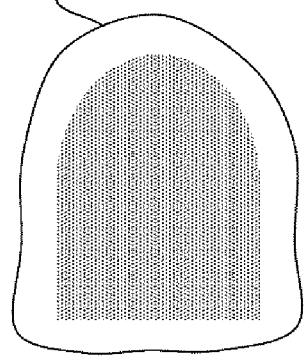
INITIAL CONTOUR
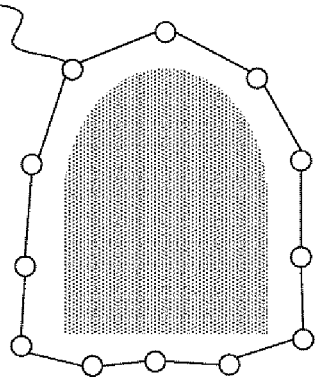
REPRESENTATIVE POINT SETTING
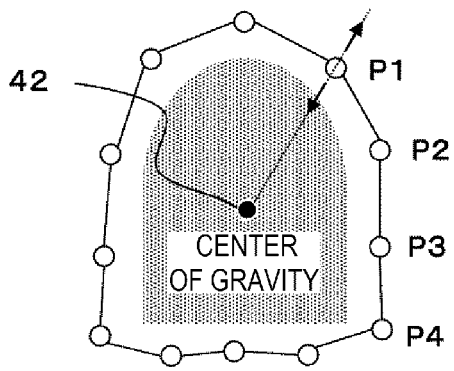
REPRESENTATIVE POINT MOVEMENT
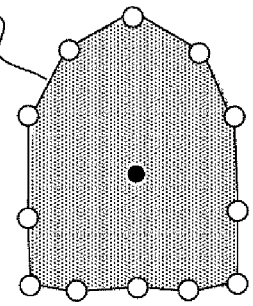
MOVEMENT COMPLETED

[FIG. 5]
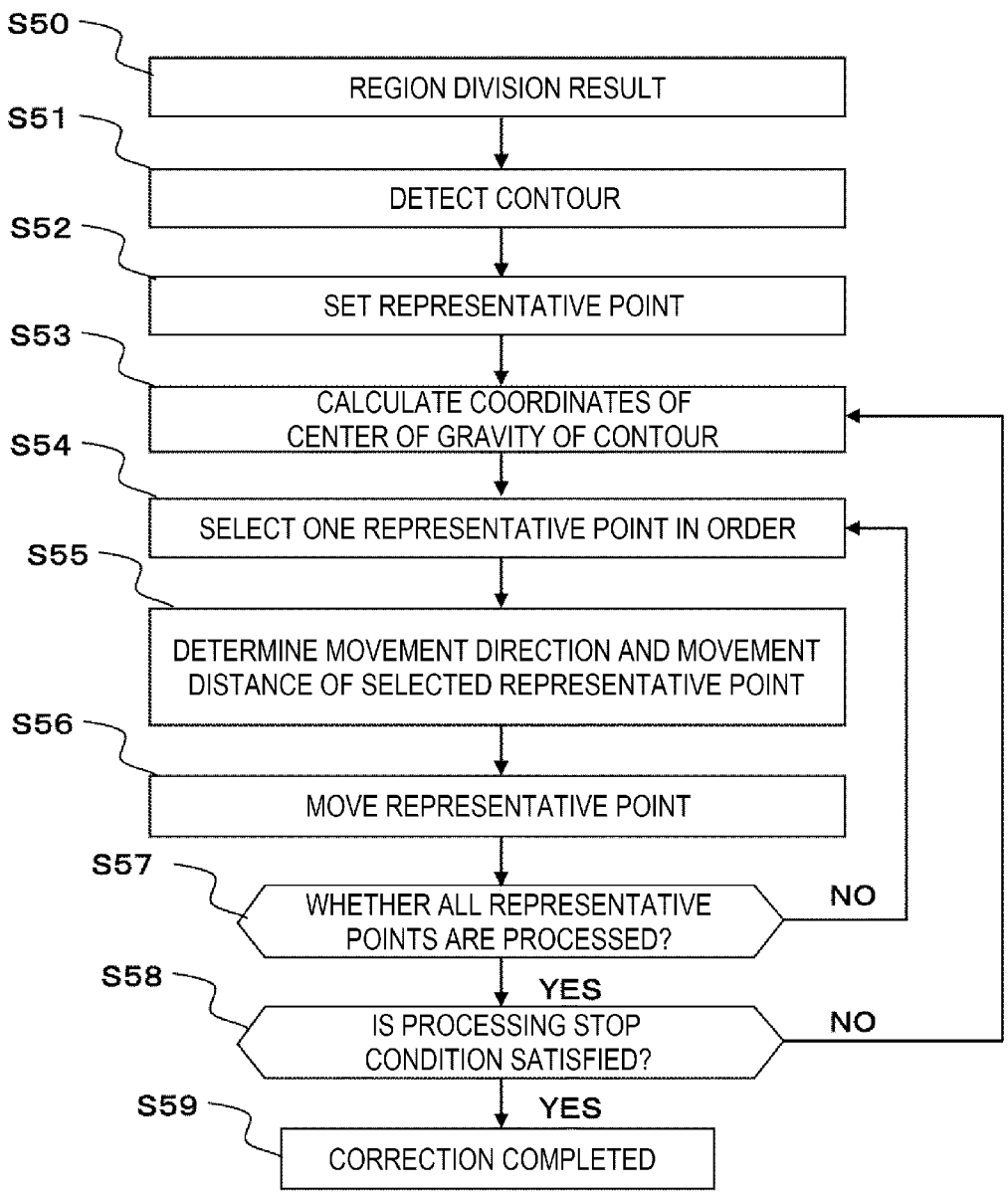

[FIG. 6]
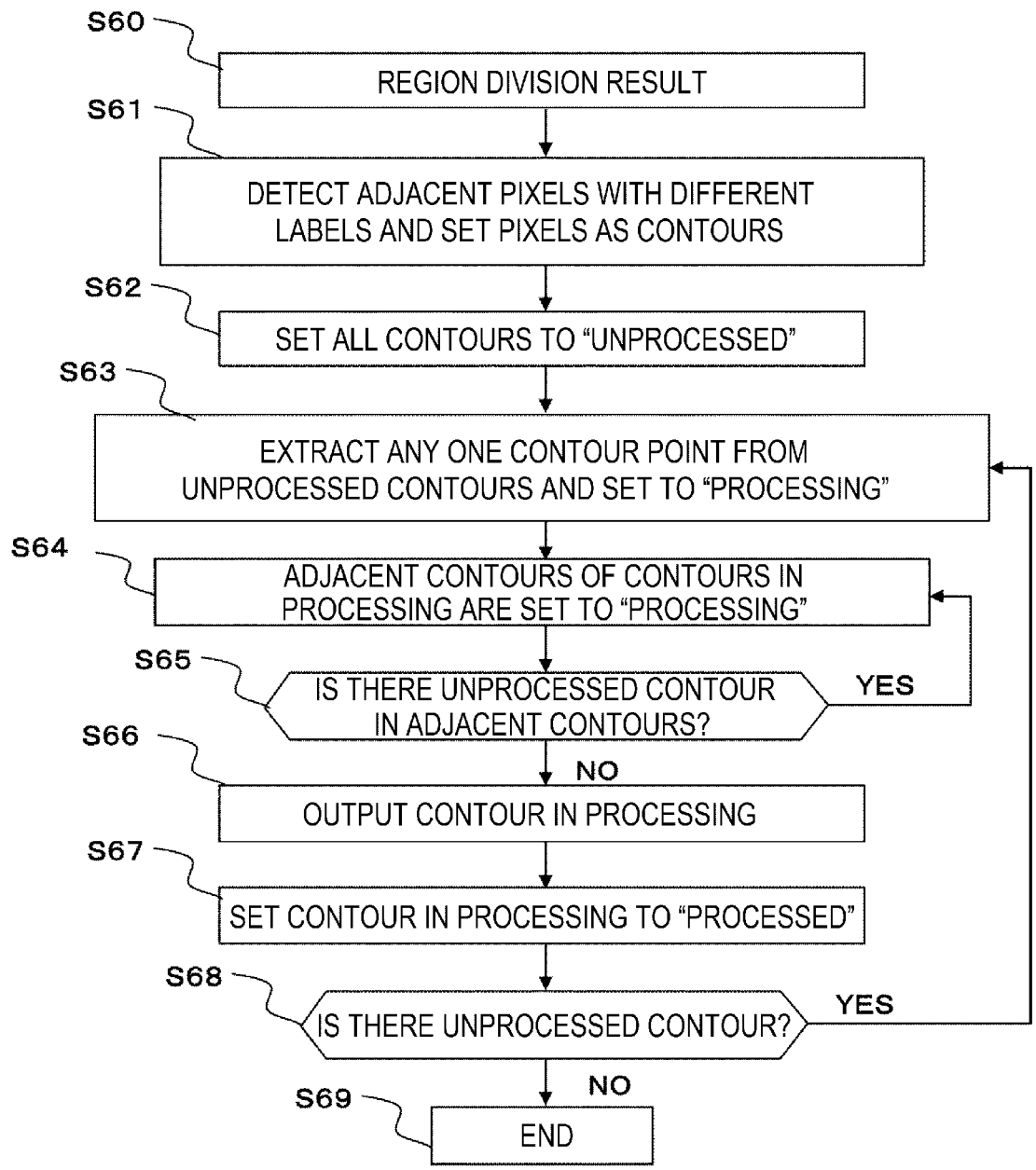

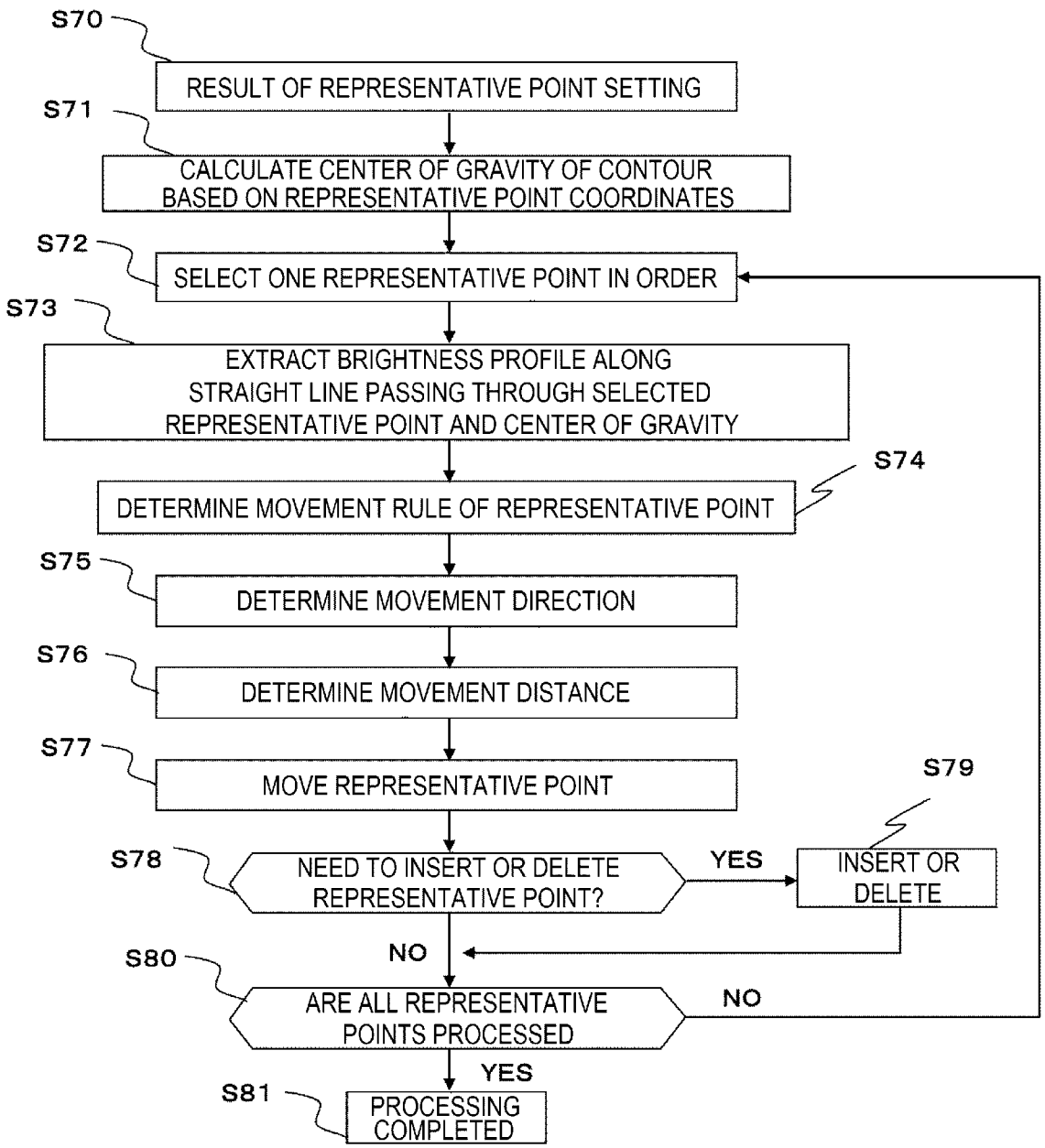

CENTER OF GRAVITY

TARGET REGION HAVING COMPLICATED SHAPE

RESULT OF DIVIDING INTO SIMPLE SHAPES

[FIG. 10]
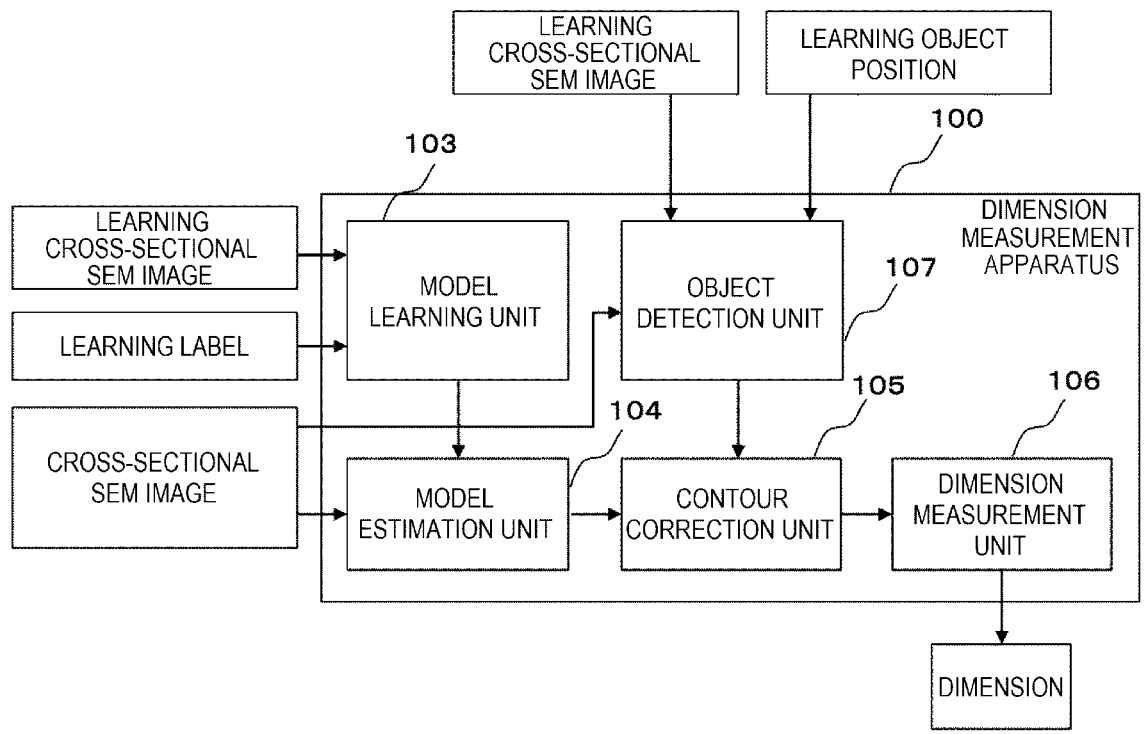

DIMENSION MEASUREMENT APPARATUS, SEMICONDUCTOR MANUFACTURING APPARATUS, AND SEMICONDUCTOR DEVICE MANUFACTURING SYSTEM

TECHNICAL FIELD

The present invention relates to a dimension measurement apparatus capable of automatically measuring a dimension of a device structure based on a cross-sectional image of a device obtained by an observation device, a semiconductor manufacturing apparatus, and a semiconductor device manufacturing system.

BACKGROUND ART

In the development of a semiconductor manufacturing process, it is necessary to obtain a shape dimension based on a cross-sectional image of a semiconductor device, and an automatic dimension measurement technique has been developed. In a dimension measurement process, there is processing of detecting a contour of a measurement target region in order to determine measurement positions such as a measurement start point and a measurement end point. The contour detection method includes a method of manually drawing a boundary line, an edge detection method based on a local brightness change, and a detection method using deep learning.

With either contour detection method, the detected contour may deviate from an actual contour. Therefore, an error occurs in the dimension of the device structure measured from the contour including the deviation. In order to reduce this measurement error, it is considered effective to correct the detected contour.

PTL 1 discloses a technique that corrects a contour by setting a movable point and a reference point on a contour generated in a medical image of a subject and correcting the movable point according to a positional relationship between the movable point and the reference point.

CITATION LIST

Patent Literature

PTL 1: JP-A-2013-5983

SUMMARY OF INVENTION

Technical Problem

By using the technique disclosed in PTL 1, it is possible to correct the contour more easily than manually correcting the contour little by little. However, in the technique, initial setting of a target region is required for contour correction. In medical applications, since the image may contain only one target region, an initial setting may not be necessary, but if there are a plurality of different target regions such as a cross-sectional image of a semiconductor device, the correction cannot be performed.

Further, in the technique disclosed in PTL 1, the movable point set in the contour is moved to correct the contour, but it is necessary for an operator to operate a movement method of the movable point such as a movement direction and a movement distance. Therefore, there is a problem that an effect of the contour correction is considered to depend on subjective determination of the operator, and if correction processing takes time, there is an error caused by the operator experience and the subjective determination.

An object of the invention is to solve the above problems and to provide a dimension measurement apparatus that can automatically correct a deviation of a contour without the need for operator determination during a correction processing process, a semiconductor manufacturing apparatus, and a semiconductor device manufacturing system.

Solution to Problem

In order to achieve the above object, the invention provides a dimension measurement apparatus for measuring a dimension of a measurement target using an image, in the dimension measurement apparatus, movement of a contour of the measurement target is repeated until a predetermined requirement is satisfied based on a predetermined point on the contour, and a dimension of the measurement target is measured using the repeatedly moved contour. The predetermined requirement is a requirement for correcting a deviation of a contour estimated by using machine learning.

The movement of the contour in the dimension measurement apparatus of the invention is performed after the contour is estimated by machine learning.

Advantageous Effect

By correcting a contour detected from a cross-sectional image, it is possible to improve a measurement accuracy of automatic dimension measurement processing.

BRIEF DESCRIPTION OF DRAWINGS

FIG. 1 is a diagram showing a configuration example of a semiconductor manufacturing apparatus according to each embodiment.

FIG. 2 is a diagram showing an example of dimension measurement processing according to a first embodiment.

FIG. 3 is a diagram showing an example of a contour correction effect according to the first embodiment.

FIG. 4 is a diagram showing an example of contour correction processing according to the first embodiment.

FIG. 5 is a diagram showing an example of a contour correction processing flow according to the first embodiment.

FIG. 6 is a diagram showing an example of a contour detection processing flow according to the first embodiment.

FIG. 7 is a diagram showing an example of a representative point movement processing flow according to the first embodiment.

FIG. 10 is a diagram showing an example of dimension measurement processing including object detection according to the second embodiment.

DESCRIPTION OF EMBODIMENTS

Figure 8A:
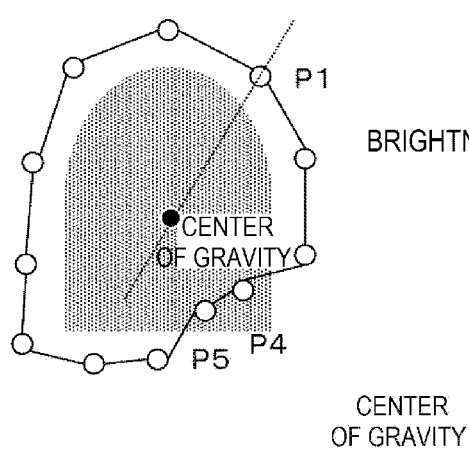
FIGS. 8A to 8C are diagrams showing an example of a brightness profile according to the first embodiment.

An embodiment of the invention is a plasma processing apparatus including a dimension measurement apparatus. The dimension measurement apparatus of the plasma processing apparatus is a general computer including a processor and a memory, and may be an implementation of software that processes according to a program, or may be an implementation of dedicated hardware instead of the general computer.

Further, dedicated hardware may be embedded in the computer, and the software implementation and the hardware implementation may be combined and implemented. The dimension measurement apparatus may be externally connected, or may be externally connected as a module that is also used for other data processing. Hereinafter, various embodiments will be described with reference to the drawings.

A movement rule is used in the present specification, and the movement rule includes a plurality of rules. One rule includes a brightness profile, a determination condition of a movement direction corresponding to the brightness profile, and a determination condition of a movement distance corresponding to the brightness profile. The brightness profile in which the movement rule can be preset based on a relationship between an SEM image targeted by the dimension measurement apparatus and a material or a shape is information for selecting one appropriate rule from a plurality of rules. The movement direction determines whether a representative point moves toward or away from a center of gravity. The movement distance determines how many pixels the representative point are moved. If there is no need to move, the number will be 0.

First Embodiment

The first embodiment is an embodiment of a plasma processing apparatus which is a semiconductor manufacturing apparatus including a dimension measurement apparatus.

A plasma processing apparatus 1 shown in FIG. 1 includes a dimension measurement apparatus 10, an input and output device 11, an input device 12, an output device 13, a processing condition search device 14, a processing device 15, and an evaluation device 16.

A target processing result such as a processing shape and parameters used in a processing device are selected and input to the plasma processing apparatus 1 from the input device 12, and optimum processing conditions that give a target processing shape are output.

The processing condition search device 14 is a device that receives the target processing shape from the input device 12 and outputs the optimum processing conditions to the output device 13.

The input device 12 includes an input interface such as a GUI and a storage medium reading device such as a card reader, and inputs various data to the processing condition search device 14. Further, a dimension measurement value is received not only from a user but also from the input and output device 11 in the same manner and input to the processing condition search device 14. The input device 12 includes, for example, a keyboard, a mouse, a touch panel, the storage medium reading device, and the like.

The output device 13 displays processing conditions transferred from the processing condition search device 14 as the optimal processing conditions to the user. Methods for displaying includes displaying on a display, or writing to a file, and the like. The output device 13 includes, for example, a display, a printer, a storage medium writing device, and the like.

The processing device 15 is a device that processes a semiconductor for a semiconductor device including a semiconductor. Processing contents of the processing device are not particularly limited. For example, a lithographic device, a film forming device, and a pattern processing device are included. The lithography device includes, for example, an exposure device, an electron beam drawing device, and an X-ray drawing device. The film forming device includes, for example, a chemical vapor deposition (CVD), a physical vapor deposition (PVD), a vapor deposition device, a sputtering device, and a thermal oxidation device. The pattern processing device includes, for example, a wet etching device, a dry etching device, an electron beam processing device, and a laser processing device.

The processing device 15 processes the semiconductor or the semiconductor device based on the processing condition received from a processing condition searching device, and transfers the processing to the evaluation device 16.

The evaluation device 16 images a cross section of the semiconductor or the semiconductor device processed by the processing device 15 and obtains an image 17 of the cross section which is the processing result. The evaluation device 16 includes a scanning electron microscope (SEM), a transmission electron microscope (TEM), and a processing dimension measurement apparatus using an optical monitor. A part of the semiconductor or the semiconductor device processed by the processing device 15 may be taken out as a fragment, and the fragment may be transported to the evaluation device 16 for measurement. The obtained cross-sectional image 17 is transferred to the input and output device 11.

The dimension measurement apparatus 10, in which a dimension of a measurement target is measured using an image, is a dimension measurement apparatus that repeats movement of a contour until a predetermined requirement is satisfied based on a predetermined point on the contour of the measurement target, and measures a dimension of the measurement target using the repeatedly moved contour. The predetermined requirement is a requirement for correcting a deviation of a contour estimated by using machine learning.

In the dimension measurement apparatus, the movement of the contour is performed after the contour is estimated by machine learning. Then, the dimension of the measurement target is measured by using the contour estimated by the machine learning using the repeatedly moved contour as learning data.

A dimension measurement apparatus for a cross-sectional structure of a device that is a measurement target includes: a model learning unit that obtains a learning cross-sectional image and learning labels attached to different regions of the learning cross-sectional image and generates a model using the learning cross-sectional image and the learning labels; a model estimation unit that applies the model to a target image and labels each independent region; a contour correction unit that detects a contour of each region using the target image and the labels attached by the model estimation unit, sets a representative point on the contour of the region, and repeats movement of the contour according to a movement rule of each representative point until a correction completion condition is satisfied; and a dimension measurement unit that measures a dimension of a device cross-sectional structure using the contour corrected by repeating the movement in the contour correction unit.

As shown in FIG. 1, the dimension measurement apparatus 10 includes a central processing unit 101 and a database 102. The central processing unit 101 functions as the model learning unit, the model estimation unit, the contour correction unit, and the dimension measurement unit that perform machine learning. The central processing unit 101 receives definition of a feature point and a dimension, magnification, learning data sets, and a cross-sectional image which are input via the input and output device 11, and measures a predetermined dimension based on the cross-sectional image and outputs the predetermined dimension to the input and output device 11.

The input and output device 11 includes an input and output interface such as a GUI and a storage medium reading device such as a card reader, and inputs the definition of the feature point and the dimension, the magnification, and the learning data sets to the dimension measurement apparatus 10. Further, the input and output device 11 receives the cross-sectional image from the evaluation device 16 and transfers the cross-sectional image to the central processing unit 101. The input and output device 11 includes, for example, a keyboard, a mouse, a display, a touch panel, the storage medium reading device, and the like. Further, a dimension value transferred from the dimension measurement apparatus 10 is displayed to the user or directly transferred to the input device 12. When displaying the dimension value to the user, methods include displaying on the display, writing to a file, and the like.

FIG. 2 is a diagram showing an example of the dimension measurement processing in the dimension measurement apparatus 10. The processing of the dimension measurement apparatus 10 includes processing of a model learning unit 103, a model estimation unit 104, a contour correction unit 105, a dimension measurement unit 106, and the like.

The model learning unit 103 generates a deep learning model for image region division using an input learning SEM image and the learning label, and transmits the deep learning model to the model estimation unit 104. The learning SEM image is prepared by the user in advance, and is, for example, a 1280×960 grayscale pixel matrix. The number of images to be prepared may be determined based on a deep learning algorithm and a structure of a deep network. The learning label is attached to each pixel of the learning SEM image in advance by the user, and is a number such as 0, 1, or 2.

The model learning unit 103 inputs the learning cross-sectional image and the learning label into a deep learning method of image division to generate a deep learning model, and the model estimation unit applies this model to the target image and labels the target image.

For example, as shown in FIG. 3, when the SEM image has three types of regions, vacuum 30, mask 31, and silicon 32, the regions are respectively indicated by using number 0 (vacuum), number 1 (mask), and number 2 (silicon) as labels. Here, the number of independent regions in the SEM image is not limited to three. There may be a plurality of regions of each type. In this example, a 1280×960 label matrix is generated for one SEM image, and formats of label storage and input and output may follow the requirement of the deep learning algorithm.

The model estimation unit 104 applies the learning model generated by the model learning unit 103 to the input SEM image, generates a label for the image (for example, a number matrix of 1280×960), and transmits the label to the contour correction unit 105.

The contour correction unit 105 extracts a contour of the independent region from label information, corrects the contour using brightness information in the SEM image, and transmits the corrected contour to the dimension measurement unit 106.

At this time, at least one movement rule corresponding to a brightness profile is specified in advance, and the contour correction unit 105 compares a brightness profile extracted from a straight line passing through a representative point to be moved and a center of gravity with the brightness profile specified in advance, and applies the movement rule corresponding to the specified brightness profile having the highest similarity. Then, the contour correction unit extracts the contour from the independent regions divided by the model estimation unit and sequentially outputs the contour. The dimension measurement unit 106 calculates and outputs dimension information such as a width, a height, and an area of a measurement target region using the corrected contour.

A contour correction effect will be described with reference to FIG. 3. FIG. 3 shows only a part of the 1280×960 SEM image. The SEM image of the embodiment has three types of regions, the vacuum 30, the mask 31, and the silicon 32. Then, regarding the mask type, there are a plurality of independent regions that are not connected to each other. White lines 311, 312, and 313 surrounding three mask regions are contours extracted based on label information generated by the model estimation unit. What is displayed as a deviation is a difference between the extracted contour and an actual contour. The processing of the contour correction unit 105 corrects a contour deviation as shown in a contour 311 before the correction and a contour 314 after the correction in FIG. 3.

In the SEM image of FIG. 3, there are three types of regions, but the number of types of regions is not limited to three, and may be n types of regions. That is, the learning label is described by attaching n different numbers to each pixel of the target image when the target image has n different types of regions.

FIG. 4 is a diagram showing an example of the contour correction processing, in which contour correction is performed on one mask region by a series of processing including an initial contour, a representative point setting, representative point movement, and movement completion. That is, a contour 40 of one mask is extracted based on the label information generated by the model estimation unit 104. The contour 40 is called the initial contour. As shown in the contour 40, the initial contour deviates from a contour of an actual mask displayed in gray. The necessity of the processing of extracting a contour of a single region such as a contour of one mask will be described later. Further, a method of extracting the contour of the single region will be described later.

Next, for contour correction, first, the representative point setting for setting a plurality of representative points 41 in the initial contour is performed. The contours during and after correction are formed by straight lines connecting the representative points 41 and the representative points 41. In the representative point setting of FIG. 4, 12 representative points are shown as an example, but the actual number of representative points may be larger than 12. When comparing the contour displayed by the straight lines between these representative points and the contour 40 which is the initial contour, the smaller the number of representative points, the coarser the contour displayed by the representative points. On the other hand, if the number of representative points increases, a correction processing time is long, and a positional relationship between adjacent representative points may be confused. In the actual processing, representative points may be set at predetermined intervals. The predetermined interval can be adjusted by using 5 pixels of experience value or by the user. Further, contour pixels of a predetermined ratio (for example, 25%) of the total number of pixels of a contour may be randomly selected and set as representative points.

Next, in order to move the representative points, a center of gravity of the contour is calculated using the set representative points. The center of gravity here is calculated by an average value of representative point coordinates (x, y). The center of gravity is an important reference point for the subsequent correction processing, and the center of gravity of each independent region is required to be calculated individually. Therefore, it is necessary to extract the independent region, and it is necessary to divide the image region for extracting the independent region. There are many methods for directly detecting a contour (edge) without dividing the image, but in the present embodiment, region division processing is performed.

As shown in the representative point movement in FIG. 4, the contour correction is performed by moving each representative point 41. For example, P1 is moved along a straight line passing through the representative point P1 and a center of gravity 42. The purpose of the movement is to correct a deviation to bring the representative point closer to the actual contour. Then, the representative points are moved in order. For example, all representative points are moved in the order of P1, P2, P3, and P4. The contour movement processing is repeated in order to move all the representative points to an optimum position, in other words, to the actual contour. A contour 43 of a result of the last move completion is displayed in the movement completion of FIG. 4. Determination of a movement direction and a movement distance of the representative point will be described later.

FIG. 5 is a diagram showing an example of a contour correction processing flow. Data input to the contour correction unit is a region division result (S50) obtained by dividing the SEM image. In the present embodiment, the result includes the 1280×960 SEM image and a 1280×960 number matrix of labels. Possible values for the labels correspond to FIG. 3 and are number 0 (vacuum), number 1 (mask), and number 2 (silicon).

First, in the contour detection processing, pixels belonging to the contour are detected by the label (S51). Here, for example, a contour of an independent region, which is one mask region, is detected and processed. In order to extract the contours of the plurality of independent regions from one SEM image, the correction processing is performed one by one in order. The method of extracting the independent region will be described later.

The contour correction unit calculates a center of gravity of the contour based on coordinates of each representative point, selects a movement rule according to the brightness profile extracted from the positional relationship between the representative point to be moved and the center of gravity and the straight line passing through the representative point to be moved and the center of gravity, and determines a method of moving the representative point. Further, the contour correction unit determines the movement direction according to the selected movement rule, selects the movement rule according to the brightness profile, and determines the movement distance according to the selected movement rule.

The contour correction processing of one independent region will be described below. As described in the above-described representative point setting, representative points are set at equal intervals (5 pixels) (S52). Then, the center of gravity of the contour is calculated by averaging the coordinates of the representative points (S53). A unit of coordinates is a pixel, and the coordinates of the center of gravity are rounded integers of calculated average values. Any one representative point is selected. The movement direction and the movement distance of the selected representative point are determined (S55), and the representative point is moved (S56). When there is an unmoved representative point, the next representative point is selected (S54).

When all the representative points are moved (S57), it is determined whether the correction completion condition, that is, a stop condition is satisfied (S58). The stop condition is determined by a sum of the movement distances of the representative points. For example, when the sum of the movement distances of the representative points this time is smaller than, for example, 10 pixels, the contour correction is completed (S59). When the sum of the movement distances of the representative points is larger than 10 pixels, the processing returns to the step of calculating the center of gravity and moves the representative points again.

FIG. 6 is a diagram showing an example of a contour detection processing flow. A method of extracting the contour of the independent region will be described with reference to the figure. The region division result is received (S60), in the labels (1280×960 number matrix), for example, each pixel is checked in order from the upper left of the matrix, and adjacent pixels with different numbers are detected as contours (S61). All contour pixels are set to an "unprocessed" state (S62). Any one pixel is extracted from the unprocessed contour pixels and is set to a "processing" state (S63).

Next, when there are unprocessed contour pixels in the adjacent contour pixels of all the contour pixels in processing, the unprocessed contour pixels are set to the "processing" state (S64). The setting is repeated until there are no unprocessed contour pixels in the adjacent contour pixels of all the contour pixels in processing (S65). As a result, the contour of the independent region including the first extracted contour pixel can be extracted.

Contour information of the extracted independent region is output to the next representative point setting step, and the contour state is set to "processed" (S67). When there are still unprocessed contours (S68), the processing returns to the previous step, then the contour of the independent region is extracted, and when there are no unprocessed contours, the processing is completed (S69).

FIG. 7 is a diagram showing an example of a representative point movement processing flow. The center of gravity is calculated based on a result (S70) of the representative point setting (S71). Then, the representative points are moved in order, and the movement of one representative point (for example, P1 in FIGS. 8A to 8C) will be described below.

Figure 8B:
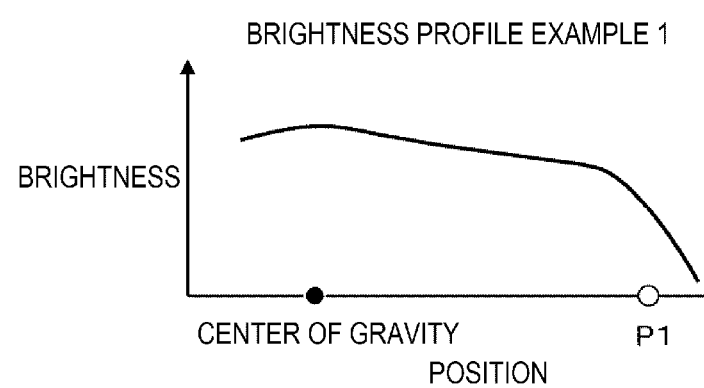
Figure 8C:
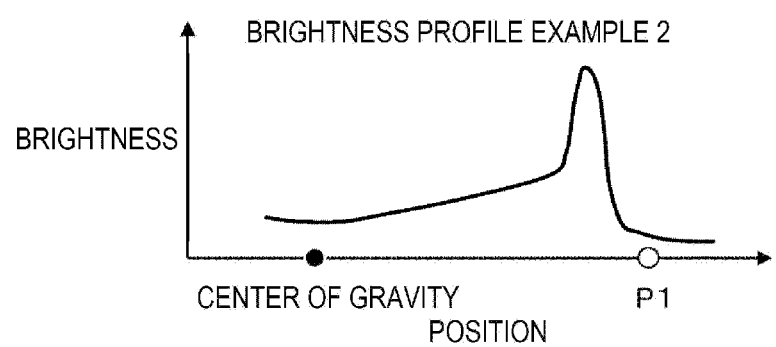

As shown in FIGS. 8A to 8C, the representative point P1 is used as a representative point to be moved (S72). A brightness profile is extracted along a straight line passing through the representative point P1 and the center of gravity (S73). A length of the brightness profile to be extracted is set long to include an actual contour pixel, as shown by a dotted line in FIG. 8A. For example, in the case of P1, the actual contour is between P1 and the center of gravity, but in the case of P4 or P5, the actual contour may be on an extension line of the center of gravity and the representative point.

The extracted brightness profile is compared with a preset brightness profile, and a corresponding movement rule is selected (S74). For example, when the brightness profile has a bright center of gravity pixel as in a brightness profile example 1 of FIG. 8B, the movement direction is toward a pixel having 90% center of gravity brightness, and the movement distance is 0.25 of the distance between the representative point and the pixel having 90% center of gravity brightness. For example, when the brightness profile has a dark center of gravity pixel as in a brightness profile example 2 of FIG. 8C, the movement direction is toward a pixel having the maximum brightness, and the movement distance is 0.25 of the distance between the representative point and the pixel having the maximum brightness.

Other rule settings and parameter settings are possible depending on features of the SEM image. For the contrast of the brightness profile, a pattern matching method of general image processing or signal processing may be used.

According to the movement rule, the movement direction and the movement distance are determined (S75 to S76), and the representative point is moved (S77). Then, in order to maintain good accuracy and continuity of the contour, the representative point is inserted and deleted after the representative point is moved (S78). For example, when the moved representative point is less than 2 pixels away from the adjacent representative point, the representative point is deleted. When the moved representative point is more than 10 pixels away from the adjacent representative point, a new representative point is inserted in the middle between the representative point and the adjacent representative point (S79). Since the new representative point is moved in the next correction processing, it does not matter if the new representative point deviates from the actual contour at the time of insertion.

The above processing is applied to all representative points, and one contour correction is completed (S80, S81).

The movement direction of the representative point is to move toward coordinates of a maximum brightness value after smoothing the brightness profile. Further, the movement distance of the representative point is halved a distance between the representative point and the maximum brightness value after smoothing the brightness profile.

Second Embodiment

In the present embodiment, processing performed when there is a region having a complicated shape will be described. The part without description is the same as that of the first embodiment. In the present embodiment, when there is a region having a complicated shape after dividing a target image, the model estimation unit divides the region having the complicated shape into a region having a plurality of simple shapes by using an object detection deep learning method.

Here, in the object detection deep learning method, a learning cross-sectional image and position information of an object having a simple shape are input to the deep learning method, an object detection model is generated, the model is applied to an input target image, a position of the object having the simple shape is detected, and a contour of a region having the complicated shape is divided according to the position of the detected object.

Figure 9A:
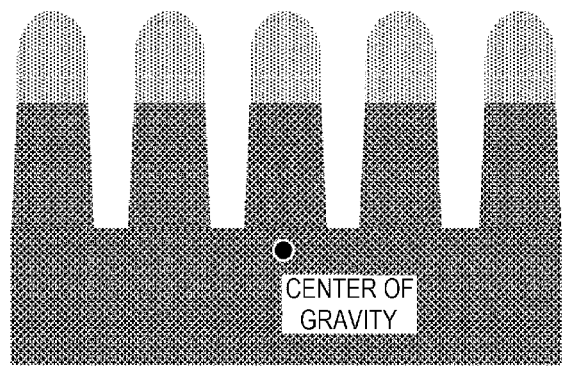
FIGS. 9A and 9B are diagrams showing an example of processing of dividing a complicated region into a simple shape according to a second embodiment.
Figure 9B:
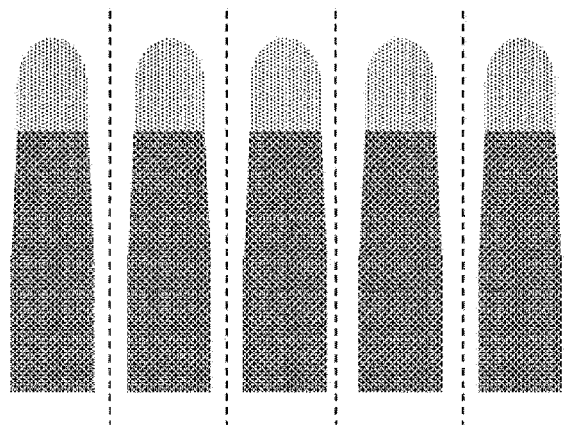

FIGS. 9A and 9B are diagrams showing an example of processing of dividing a complicated region into a simple shape. As shown in a target region having a complicated shape in FIG. 9A, even if a center of gravity of a lower silicon part is calculated, the contour cannot be corrected well. There may be a plurality of contours between a representative point and the center of gravity. On the other hand, as shown in a result of dividing the region into simple shapes in FIG. 9B, the region are divided into the simple shapes and contour correction is performed, respectively.

FIG. 10 is a diagram showing an example of a dimension measurement apparatus including an object detection unit. An object detection unit 107 generates an object detection model by a deep learning method using a learning cross-sectional SEM image and information of a learning object position. Here, the simple shape is defined as an object. The object position is coordinates (a unit is a pixel) representing a position of each simple shape. For example, the object position may be displayed by coordinates of an upper left corner and a lower right corner of a rectangle surrounding a simple shape. A specific form follows requirements of an object detection deep learning algorithm.

The object detection model is applied to the input SEM image, and coordinate information of all regions having simple shapes is output. By combining the coordinate information with a contour of a detected independent region, a contour of a complicated region can be further divided. Then, contour correction processing is performed in the same manner as the other independent regions.

The invention is not limited to the embodiments described above and includes various modifications. For example, embodiments described above have been described in detail for easy understanding of the invention, and the invention is not necessarily limited to those including all the configurations described above. In a part of a configuration of each embodiment, the configuration of the other embodiment can be added, removed, or replaced.

REFERENCE SIGN LIST

1: plasma processing apparatus
10: dimension measurement apparatus
101: central processing unit
102: database
103: model learning unit
104: model estimation unit
105: contour correction unit
106: dimension measurement unit
107: object detection unit
11: input and output device
12: input device
13: output device
14: processing condition search device
15: processing device
16: evaluation device
17: image

The invention claimed is:

1. A dimension measurement apparatus for measuring a dimension of a measurement target of etching profile using a cross-sectional Scanning Electron Microscope (SEM) image, comprising:
a central processing unit configured to
repeat a movement of a contour of the measurement target until a predetermined requirement is satisfied based on a predetermined point on the contour, the predetermined requirement being a requirement for correcting a deviation of a contour estimated by using machine learning;
measure a cross-sectional dimension of the measurement target using the repeatedly moved contour; and
perform movement of the contour based on a selected movement rule, wherein
the movement rule causes a direction of the movement of the contour to be in a first direction when a brightness profile has a center of gravity pixel with a first brightness, and to be in a second direction different from the first direction when the brightness profile has the center of gravity pixel with a second brightness.

2. The dimension measurement apparatus according to claim 1, wherein movement of the contour is performed after a contour is estimated by machine learning.

3. The dimension measurement apparatus according to claim 2, wherein the cross-sectional dimension of a measurement target of etching profile is measured by using a contour estimated by machine learning using the repeatedly moved contour as learning data.

4. The dimension measurement apparatus according to claim 1, wherein
the cross-sectional dimension of a measurement target of etching profile is measured by using a contour estimated by machine learning using the repeatedly moved contour as learning data.

5. The dimension measurement apparatus according to claim 1, wherein
a center of gravity of the contour is obtained using each predetermined point,
the movement rule is selected based on a brightness profile obtained based on a positional relationship between the predetermined point to be moved and the center of gravity, and a straight line passing through the predetermined point to be moved and the center of gravity, and
the movement rule is a criterion for moving the predetermined point.

6. The dimension measurement apparatus according to claim 5, wherein
a movement direction of the predetermined point is determined by the selected movement rule.

7. The dimension measurement apparatus according to claim 6, wherein
the brightness profile is obtained in advance and is most similar to the obtained brightness profile, and
the predetermined point is moved based on the movement rule corresponding to the brightness profile obtained in advance.

8. The dimension measurement apparatus according to claim 5, wherein
a movement distance of the predetermined point is determined by the selected movement rule.

9. The dimension measurement apparatus according to claim 8, wherein
the brightness profile is obtained in advance and is most similar to the obtained brightness profile, and
the predetermined point is moved based on the movement rule corresponding to the brightness profile obtained in advance.

10. The dimension measurement apparatus according to claim 1, wherein
the contour is obtained from each region of the measurement target of etching profile after being divided.

11. The dimension measurement apparatus according to claim 1, wherein
when there is a first region having a complicated shape of the measurement target of etching profile after the measurement target of etching profile is divided, the first region is divided into a second region having a plurality of simple shapes of the measurement target of etching profile.

12. The dimension measurement apparatus according to claim 11, wherein
a contour of the first region is divided based on a position of the simple shape estimated by inputting an image of the measurement target of etching profile into a model generated by using a learning image and position information of the simple shape.

13. A semiconductor manufacturing apparatus that manufactures a semiconductor device, the semiconductor manufacturing apparatus comprising:
a dimension measurement apparatus configured to
measure a dimension of a measurement target of etching profile using an image;
repeat movement of a contour of the measurement target of etching profile until a predetermined requirement is satisfied based on a predetermined point on the contour, the predetermined requirement being a requirement for correcting a deviation of a contour estimated by using machine learning;
measure a dimension of the measurement target of etching profile using the repeatedly moved contour; and
perform a movement of the contour based on a selected movement rule, wherein
the movement rule causes a direction of the movement of the contour to be in a first direction when a brightness profile has a center of gravity pixel with a first brightness, and to be in a second direction different from the first direction when the brightness profile has the center of gravity pixel with a second brightness.

14. A semiconductor device manufacturing system, comprising:
processor that executes programmed instructions which, when executed by the processor, cause the processor to perform operations for dimension measurement processing of measuring a dimension of a measurement target of etching profile using a cross-sectional Scanning Electron Microscope (SEM) image, comprising:
a step of repeating movement of a contour of the measurement target of etching profile until a predetermined requirement is satisfied based on a predetermined point on the contour, the predetermined requirement being a requirement for correcting a deviation of a contour estimated by using machine learning; and
a step of measuring a dimension of the measurement target of etching profile using the repeatedly moved contour, wherein
the predetermined requirement is a requirement for correcting a deviation of a contour estimated by using machine learning; and
a step of performing a movement of the contour based on a selected movement rule, wherein
the movement rule causes a direction of the movement of the contour to be in a first direction when a brightness profile has a center of gravity pixel with a first brightness, and to be in a second direction different from the first direction when the brightness profile has the center of gravity pixel with a second brightness.

* * * * *